United States Patent
Aspas Puertolas et al.

(10) Patent No.: US 8,947,881 B2
(45) Date of Patent: Feb. 3, 2015

(54) HOUSING FOR AN ON-BOARD ELECTRONIC CARD

(75) Inventors: Jesus Aspas Puertolas, Paris (FR); Nicolas Maisonnave, Paris (FR); Emile Colongo, Montesquieu Volvestre (FR); Sylvain Bourdou, Pessac (FR)

(73) Assignee: European Aeronautic Defence and Space Company EADS France, Paris (FR)

( * ) Notice: Subject to any disclaimer, the term of this patent is extended or adjusted under 35 U.S.C. 154(b) by 591 days.

(21) Appl. No.: 13/264,185

(22) PCT Filed: Apr. 6, 2010

(86) PCT No.: PCT/EP2010/054553
§ 371 (c)(1),
(2), (4) Date: Feb. 22, 2012

(87) PCT Pub. No.: WO2010/118971
PCT Pub. Date: Oct. 21, 2010

(65) Prior Publication Data
US 2012/0140417 A1    Jun. 7, 2012

(30) Foreign Application Priority Data
Apr. 14, 2009   (FR) ..................................... 09 52450

(51) Int. Cl.
*H05K 7/20* (2006.01)

(52) U.S. Cl.
CPC .................................. *H05K 7/2049* (2013.01)
USPC ........... 361/709; 361/710; 361/714; 361/715; 361/719; 165/80.3; 165/185; 257/718; 257/719

(58) Field of Classification Search
USPC ............ 361/709, 710, 714, 715, 719; 385/92; 372/36; 353/57; 362/294, 345, 373, 362/580, 547, 218, 264; 398/117, 164; 165/80.3, 185; 257/718, 719
See application file for complete search history.

(56) References Cited

U.S. PATENT DOCUMENTS 5,159,534 A * 10/1992 Hudson et al. ................ 361/730
5,278,730 A *  1/1994 Kikinis ..................... 361/679.32

(Continued)

FOREIGN PATENT DOCUMENTS

DE      102 06 271      8/2003
EP      1 248 507       10/2002

(Continued)

OTHER PUBLICATIONS

International Search Report dated Jul. 7, 2010, corresponding to the PCT application No. PCT/EP2010/054553.

*Primary Examiner* — Anatoly Vortman
(74) *Attorney, Agent, or Firm* — Young & Thompson

(57) ABSTRACT

A housing (1) for at least one electronic card (2), designed for the aeronautics field, of the type having a standardized width and including two lateral guides designed to work together with slides provided on the inner surfaces of an electronics bay,
  includes two half-shells, upper (4) and lower (5), pressed together at the lateral guides;
  the lower half-shell includes at least one bearing area (10) forming the housing for electronic cards;
  elements (19) for pressing each electronic card (2) in each corresponding housing and for pressing at least one heat sink (16) against the upper surface of at least one electronic card;
  the function of the body (5) is to take into account the mechanical stresses linked to the electronic cards hosted within the housing, and the function of the cover (4) is to ensure adequate thermal conductivity to allow heat produced by an electronic card in operation to be dissipated.

19 Claims, 5 Drawing Sheets

(56) References Cited

U.S. PATENT DOCUMENTS

Figure 1:
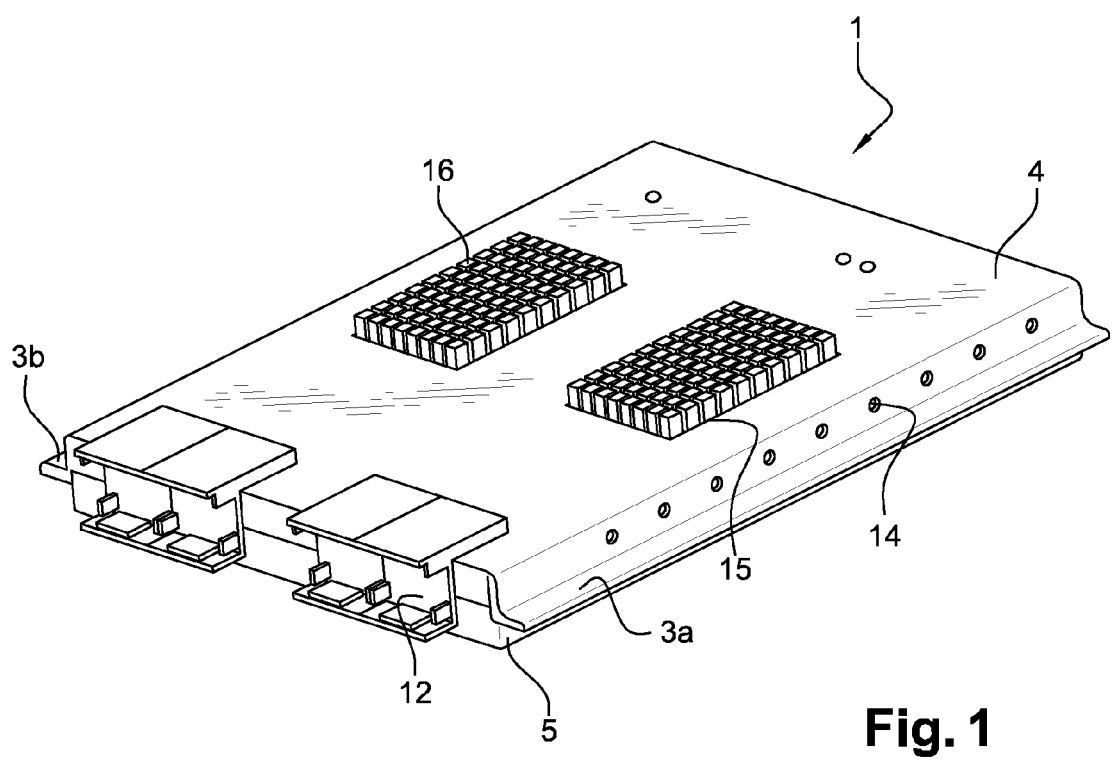

| | | | |
|---|---|---|---|
| 6,166,919 A * | 12/2000 | Nicolici et al. | 361/800 |
| 6,600,611 B2 * | 7/2003 | Inujima et al. | 359/808 |
| 6,673,998 B1 | 1/2004 | Wu | |
| 6,893,293 B2 * | 5/2005 | Ice et al. | 439/607.2 |
| 6,916,122 B2 * | 7/2005 | Branch et al. | 385/92 |
| 6,922,516 B2 * | 7/2005 | Kurashima et al. | 385/134 |
| 6,935,882 B2 * | 8/2005 | Hanley et al. | 439/372 |
| 7,048,452 B2 * | 5/2006 | Malagrino, Jr. | 385/92 |
| 7,061,773 B2 * | 6/2006 | Chen | 361/816 |
| 7,131,859 B1 * | 11/2006 | Zumbrunnen et al. | 439/487 |
| 7,178,996 B2 * | 2/2007 | Malagrino et al. | 385/92 |
| 7,195,403 B2 * | 3/2007 | Oki et al. | 385/92 |
| 7,265,984 B2 * | 9/2007 | Numata | 361/719 |
| 7,312,998 B2 | 12/2007 | Kamemoto et al. | |
| 7,317,617 B2 * | 1/2008 | Meadowcroft et al. | 361/715 |
| 7,322,850 B2 * | 1/2008 | Neer et al. | 439/567 |
| 7,371,965 B2 * | 5/2008 | Ice | 174/50 |
| 7,491,090 B2 * | 2/2009 | Oki et al. | 439/607.17 |
| 7,530,835 B2 * | 5/2009 | Yu et al. | 439/372 |
| 7,974,098 B2 * | 7/2011 | Oki et al. | 361/715 |
| 2002/0154487 A1 | 10/2002 | Weischhoff Van Rijn | |
| 2003/0002824 A1 * | 1/2003 | Chan et al. | 385/92 |
| 2003/0141090 A1 * | 7/2003 | Kruger et al. | 174/50 |
| 2003/0169983 A1 * | 9/2003 | Branch et al. | 385/92 |
| 2003/0236019 A1 * | 12/2003 | Hanley et al. | 439/372 |
| 2004/0027816 A1 * | 2/2004 | Ice | 361/797 |
| 2004/0101257 A1 * | 5/2004 | Kruger et al. | 385/92 |
| 2004/0203289 A1 * | 10/2004 | Ice et al. | 439/607 |
| 2005/0226571 A1 * | 10/2005 | Malagrino et al. | 385/92 |
| 2006/0270275 A1 * | 11/2006 | Morohashi et al. | 439/607 |
| 2006/0274518 A1 * | 12/2006 | Yu et al. | 361/816 |
| 2007/0134003 A1 * | 6/2007 | Lee et al. | 398/164 |
| 2008/0031620 A1 * | 2/2008 | Hudgins et al. | 398/9 |
| 2008/0247762 A1 * | 10/2008 | Yoshikawa et al. | 398/138 |
| 2013/0210275 A1 * | 8/2013 | Fish et al. | 439/620.01 |
| 2014/0036450 A1 * | 2/2014 | Facusse et al. | 361/710 |

FOREIGN PATENT DOCUMENTS

| | | | |
|---|---|---|---|
| EP | 1 689 220 | 8/2006 | |
| EP | 1 791 177 | 5/2007 | |
| JP | 2005 116650 | 4/2005 | |
| JP | 2010085805 A * | 4/2010 | G02B 6/42 |
| WO | WO 03060583 A1 * | 7/2003 | G02B 6/42 |

* cited by examiner

HOUSING FOR AN ON-BOARD ELECTRONIC CARD

BACKGROUND OF THE INVENTION

The present invention falls within the field of avionics. More specifically, it relates to a housing for on-board electronic cards in aircraft.

DESCRIPTION OF THE RELATED ART

In known manner, to improve their level of performance, safety, comfort, automation, etc., current aircraft have more and more on-board equipment, which is controlled by electronic cards.

These must then be mechanically fastened to the aircraft's structure and comply with various normalized safety constraints (protection from shocks and dust, reaction to mechanical forces, constraints relating to thermal dissipation or to withstanding a given temperature range, constraints relating to withstanding electromagnetic fields, etc.).

As is known, the performance of electronics is constantly improving due to, amongst others, components becoming increasingly powerful (processors in particular). A consequence of this evolution is ever greater amounts of dissipated heat (several tens of watts per electronic card), which requires heat dissipation means dedicated to the on-board electronic cards, e.g. passive radiator-type or active ventilator- or caloduct-type sinks.

Lastly, for obvious reasons of the airborne aircraft's operating safety, these electronic cards must withstand a ventilation failure as much as possible, at least on a temporary basis, without compromising the flight's safety.

Currently, the preferred solution is to use electronic housings comprising approximately five to ten electronic cards, fastened to the structure. Heat dissipation is provided by aluminum or copper sinks, fixed to the highest dissipation processors and linked to the metal structure of the housing, which is most often made of aluminum. This mechanical linkage enables thermal conduction and cooling of the processors.

In this configuration, failure of one of the cards results most of the time in dismantling and replacing the affected computer, the cost of which can be as high as several hundred thousand Euros.

Moreover, manufacturing technologies for aluminum on-board electronic housings are reaching their limits in terms of heat dissipation efficiency and weight while still keeping to electromagnetic and mechanical environment constraints.

It can be seen that the continual increase in processor power will render these current housings incompatible with heat dissipation and safety standards.

SUMMARY OF THE INVENTION

The objective of this invention is to make it easier to take into account the ever greater thermal constraints faced by on-board electronics in an aircraft.

Another objective is to facilitate electronic systems' maintenance and ability to evolve.

A third objective is to allow the electronics to be spread out to various points of the aircraft, instead of concentrating all the cards within the same computer.

To this end, the invention relates to a housing for at least one electronic card comprising heat dissipating components mainly on a surface called "upper"; the housing is a type with a standardized width and comprises two lateral guides designed to work together with slides provided on the inner surfaces of an electronics bay, which comprises two half-shells, upper and lower, pressed together at the lateral guides;

the lower half-shell comprises at least one bearing area forming the housing for the electronic card;

in addition, the housing comprises means of pressing each electronic card in each corresponding housing and of pressing at least one heat sink against the upper surface of at least one electronic card;

the function of the body is to take into account the mechanical stresses linked to the electronic cards hosted within the housing and the function of the cover is to ensure adequate thermal conductivity to allow the heat produced by an electronic card in operation to be dissipated.

According to a preferred embodiment, the lateral guides are each formed of an upper half-guide which is part of the cover and of a lower half-guide which is part of the body.

Preferably, the means of pressing is a spring, which bears firstly on the internal surface of the cover, secondly on the electronic card and lastly on a heat sink so as to press this last on a high-dissipation component of the electronic card.

In this case, the pressing spring consists advantageously of a rectangular perimeter strip designed to be placed under the inner surface of the cover, of inclined tabs placed opposite each bearing point of the body and fastened at their upper part to the rectangular perimeter strip, of a set of inclined tabs, fastened at their upper part to the rectangular perimeter strip and designed to transmit a bearing force to the upper surface of a heat sink.

Preferably, the pressing device is made of a material with very high thermal conductivity.

According to a preferred embodiment of the housing, the body is made of high temperature thermoplastic material.

This high temperature thermoplastic material is, for example, (poly-ether-ether-ketone) loaded with short fibers.

Advantageously, the body's surface is metalized.

According to a preferred embodiment of the housing, the cover comprises a blank made of very high thermal conductivity composite material, folded over the edges to adopt the shape of the body.

Advantageously, the cover comprises on its lateral edges two metal inserts each forming the housing's upper half-guide, which ensure proper thermal and electrical conduction between the cover and the electronics bay.

Preferably, the cover comprises a means of electromagnetic protection.

This means of electromagnetic protection is, for example, a metalized strip linked to the metallic material that forms the metal inserts.

In this case, the cover is made by a process that comprises a phase of laying up the fiber layers and the metalized strip on a preform, assembly with the metal inserts, then curing by heated means.

To allow the passage of tall heat sinks, the cover advantageously comprises on its upper surface at least one rectangular recess designed to let at least one heat sink pass.

According to a preferred embodiment of the housing, the thicknesses of the body and the cover are significantly different: the available space b in the housing under the electronic card is substantially less than the available space a above it.

BRIEF DESCRIPTION OF THE DRAWING FIGURES

Figure 2:
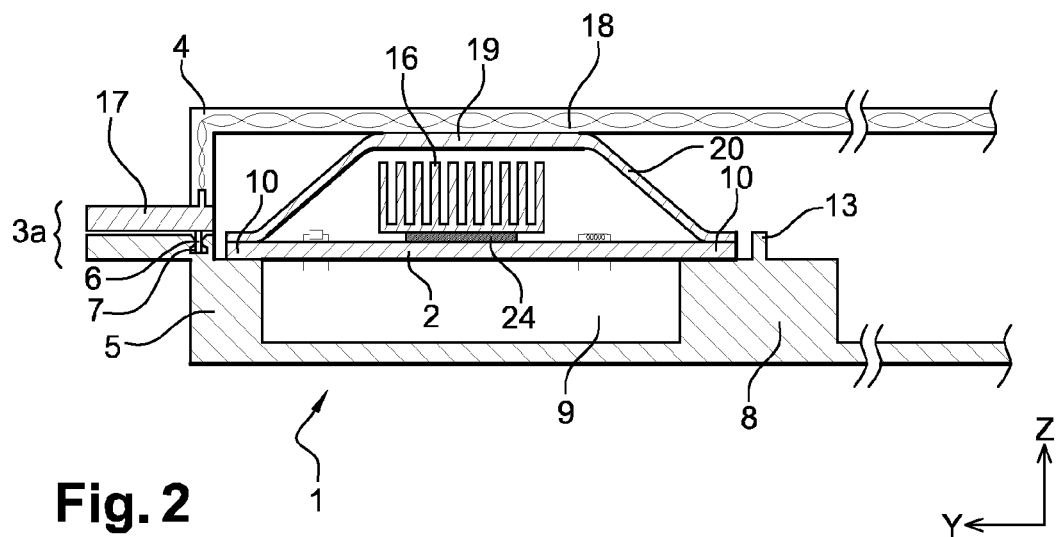
Figure 3:
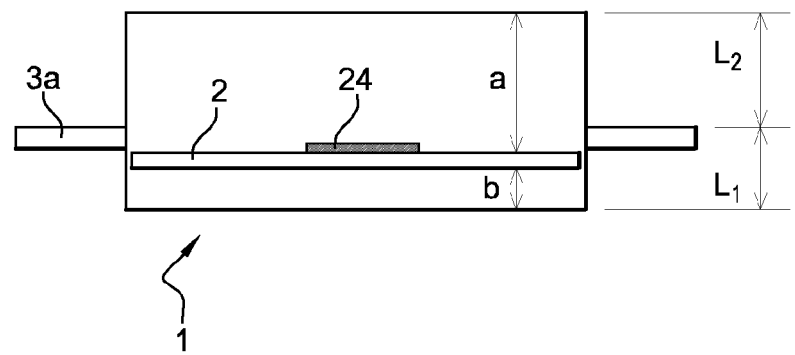
Figure 3:
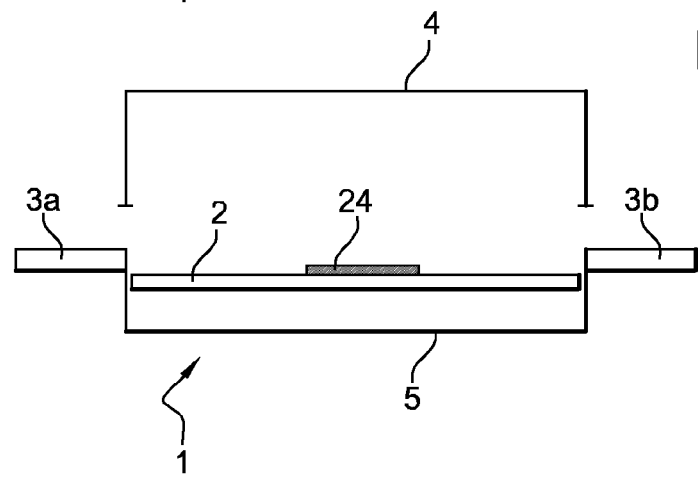
Figure 4:
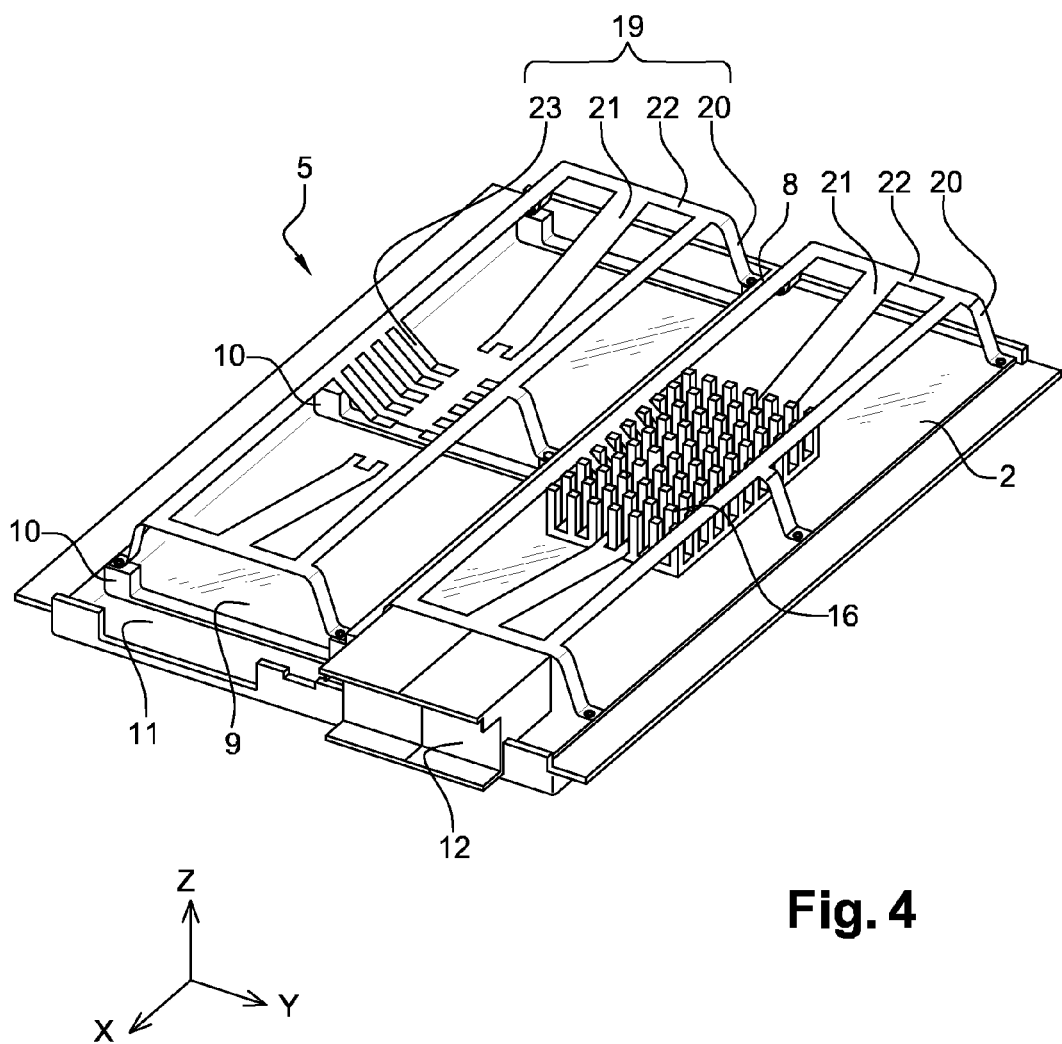
Figure 5:
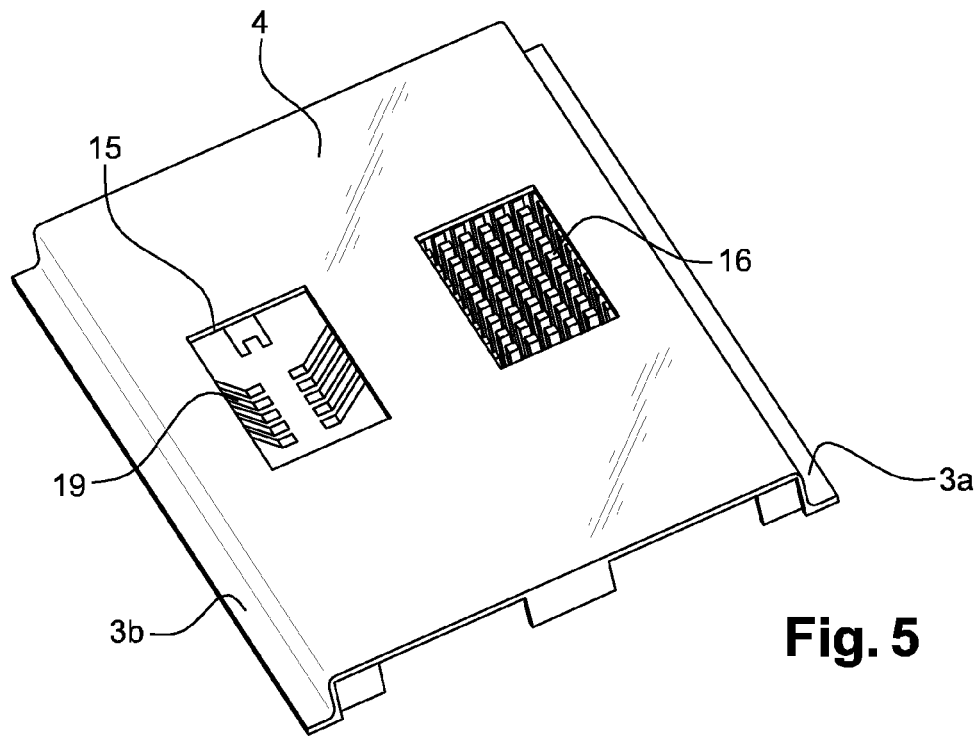
Figure 6:
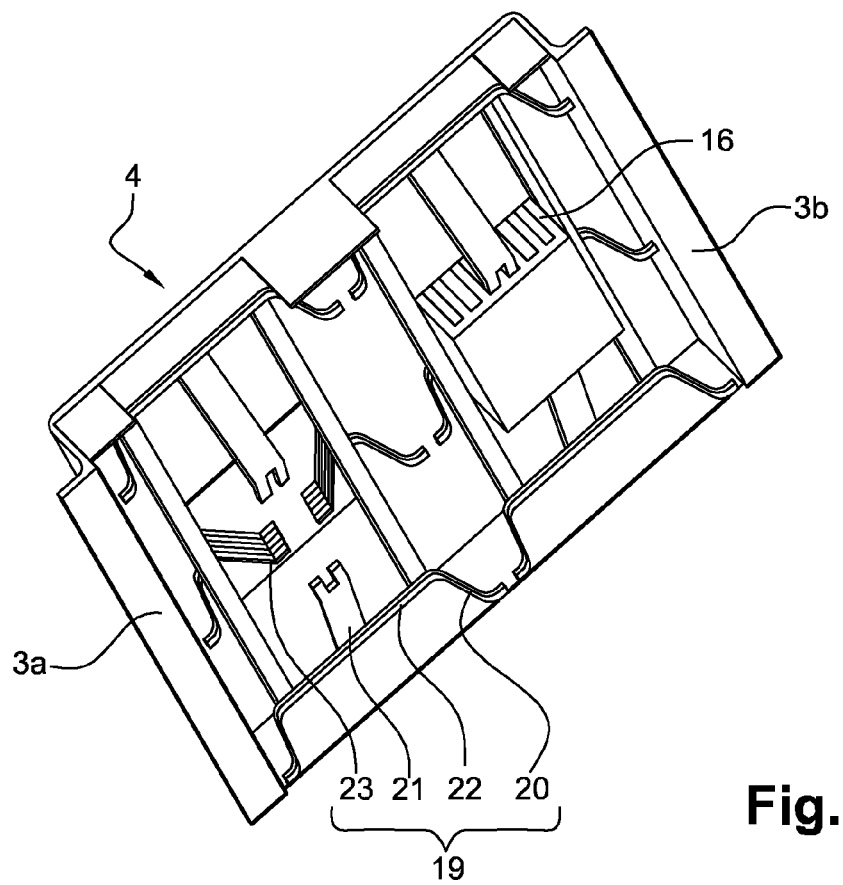
Figure 7:
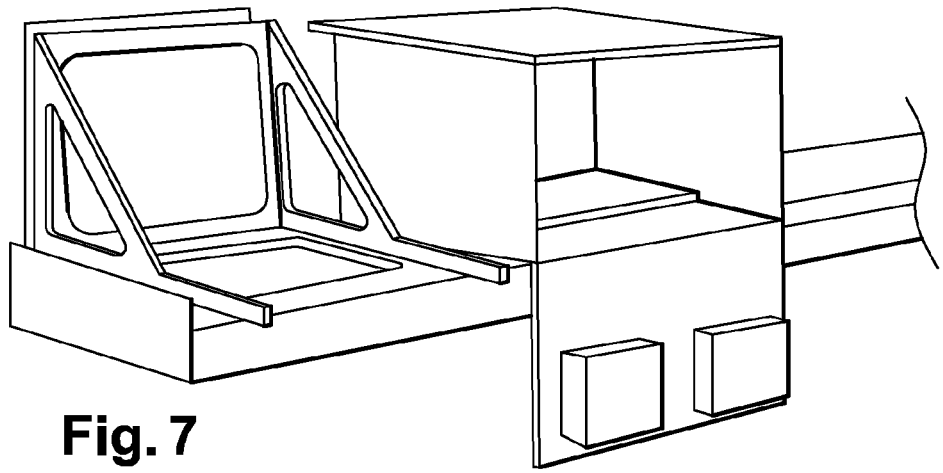
Figure 8:
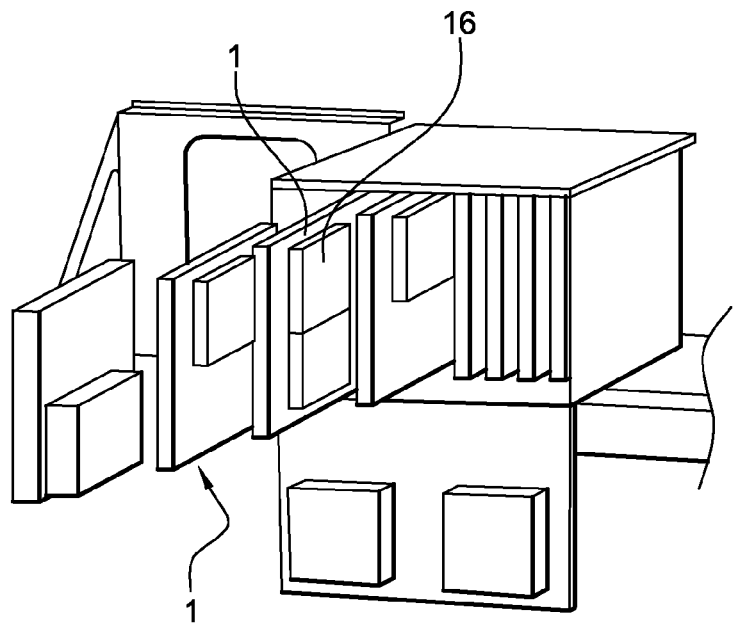

The description that follows, given solely as an example of an embodiment of the invention, is made with reference to the figures included in an appendix, in which:

FIG. 1 is a perspective view of an electronic housing according to the invention, FIG. 2 shows a cross-section view of this same housing, FIG. 3 is a schematic diagram of this housing, FIG. 4 is a perspective view of a module with its cover removed, FIG. 5 shows, in a perspective view from above, a cover fitted with pressing devices and a heat sink, FIG. 6 shows the same elements seen from below, FIG. 7 shows in perspective an electronics bay designed to receive housings according to the invention, In the same way, FIG. 8 illustrates an example implementation of the electronic housings according to the invention in an electronics bay on-board an airplane.

DETAILED DESCRIPTION OF THE INVENTION

The device according to the invention is a thin, mainly rectangular housing 1 (see FIG. 1), designed to receive one or more electronic cards 2 (not visible in FIG. 1, which illustrates a closed housing, ready to be incorporated into an electronics bay). In the non-limiting example described here, the housing receives two electronic cards side-by-side. The electronic cards in question here comprise most of their components on a same surface of the card, called "upper surface".

Typically, the dimensions of such a housing are approximately twenty centimeters long, fifteen centimeters wide and two centimeters thick. Here, they depend on the existing dimensions between the slides of electronics bays of a type standard in avionics.

This housing 1 is fitted, on two of its opposite lateral surfaces, with lateral guides 3a, 3b, able to work with the slides of an electronics bay, not detailed here. These lateral guides 3a, 3b are constant-width flat surfaces that extend perpendicularly to the surfaces that support them and are located in a plane parallel to the median plane of the housing 1.

For the remainder of the description, a longitudinal axis X is then defined corresponding to the direction of these lateral guides 3a, 3b. In the same manner, a transverse axis Y, perpendicular to these lateral guides 3a, 3b, is defined and located in the main plane of the housing 1. Lastly, a vertical axis Z completes this reference space.

As can be seen in FIG. 1, the housing 1 consists mainly of two parts: a cover 4 and a body 5. This body 5 and this cover 4 come together laterally at the guides 3a, 3b, of which they each form approximately half the thickness.

The cover 4 comes to rest on the body 5; correct positioning is ensured by plots 6 (FIG. 2) arranged under the lateral edges of the cover 4, which correspond to housings within the lateral edges of the body 5. As shown in FIG. 2, these plots 6 and housings 7 are provided substantially at the lateral guides 3a, 3b, each consisting of an upper half-guide belonging to the cover 4 and a lower half-guide belonging to the body 5.

Alternatively, the plots 6 can be replaced by longitudinal projections and the housings 7 by slides.

The arrangement of housing 1 in two elements 4, 5 which are superimposed at the lateral guides 3a, 3b allows the housing 1 to be assembled without using screws, since the body 5 and the cover 4 are pressed together as soon as the lateral guides 3a, 3b are inserted in the slides of an electronics bay. This arrangement naturally makes maintenance of these housings easier.

A function of the body 5 is to take into account the mechanical stresses linked to the electronic cards 2 hosted by the housing 1. It has a second function, to position said cards 2 correctly.

Therefore, the body 5 (see FIGS. 2 and 4) appears as a rigid shell with substantially constant thickness of one to three millimeters, separated here by a central wall 8 into two longitudinal hollow housings 9, each designed to receive an electronic card 2. The longitudinal and lateral edges of the body 5, as well as a central stop 13 (FIG. 2) limit the residual lateral play of an electronic card 2 once it is placed within its housing.

Each hollow longitudinal housing 9 comprises a set of bearing points 10 (three on each longitudinal side of the housing 9 in the case illustrated in FIG. 4).

On one of its longitudinal extremities, the body 5 has a mainly rectangular drilling 11 opposite each electronic card 2 housing, designed to enable a connector 12, fixed at the end of the electronic card 2, to be installed. These connectors 12 are of a standard type and the drilling 11 is dimensioned to match.

For reasons of reduced manufacturing costs and ability to take geometry constraints into account (housing, central wall, bearing points, drilling, etc.), the body 5 is manufactured by molding by high pressure injection of a technical plastic material, e.g. PEEK-type (Poly-Ether-Ether-Ketone) thermoplastic material, loaded, in this example, with short fibers, in a manner know per se, to improve its thermal conductivity.

The PEEK-type material selected for the body 5 does not necessarily have very good thermal or electrical properties, but is, in contrast, very easy to work to create the desired sculptures within the body 5, not costly and relatively light in spite of its good mechanical resilience. It is suited to mass-production of the body 5.

This body 5 receives a surface metallization to improve its properties as electromagnetic shield and electrical earth. The methods of manufacturing the body 5 by thermoplastic material molding and of metallization are known to experts and are therefore not detailed further here.

In contrast with the body 5, the function of the cover 4 is to ensure proper thermal conductivity allowing the heat produced by an electronic card 2 in operation to be dissipated. In addition, this cover 4 must ensure superior electromagnetic shielding of the electronic cards 2. On the other hand, its geometric shape is chosen to be simple on purpose and the cover 4 has no function of transmitting mechanical forces between the electronic cards 2 and the electronics bay.

As a result, the cover 4 (see FIGS. 5 and 6) is made mainly of a composite material blank of quasi-constant thickness (approximately one millimeter here), folded at the edges to adopt the rectangular shape of the body 5. It comprises, on each lateral surface, a set of drillings 14 (see FIG. 1) to allow ventilation of the inside of the housing 1.

In addition, it comprises, on one of its longitudinal surfaces, a recess allowing the passage of the connectors 12.

In addition, the cover 4 can comprise on its upper surface two rectangular recesses 15 designed for the passage of heat sinks 16, for example here of known type with a flat base and a matrix of elongated vertical rectangular outgrowths.

The cover 4 comprises two metal inserts 17 on its lateral edges, each forming the upper half-guide of the housing 1. These metal inserts 17, realized for example in aluminum, are used to ensure proper thermal and electrical conduction between the cover 4 and the electronics bay.

Except for these metal inserts 17, the cover 4, which must possess high thermal conductivity properties, is made in the form of a laminate including a graphitized carbon fiber with thermal properties of 800 W/mK and a metalized strip 18. This material has higher thermal conductivity than copper. However, it is difficult to utilize, which usually leads to eliminating this material for applications requiring mass-production.

The metalized strip 18 enables electromagnetic shielding of the on-board electronic cards 2. It is linked to the metallic material that forms the metal inserts 17.

In this example, the cover 4 is made by a process that associates laying up the fiber layers and the metalized strip 18 on a preform, assembly with the metal inserts 17, then curing by heated means.

The device according to the invention takes advantage of the fact that electronic cards are naturally asymmetrical with their components generally arranged on only one surface and therefore with significantly higher space and heat dissipation volume requirements on one surface than on the other. Because of this, the available space b in the housing under the electronic card is substantially less than the available space a above it, leading to a clearly lower thickness L1 of the body 5 compared with the thickness L2 of the cover 4 (FIG. 3).

Lastly, the housing 1 according to the invention comprises, for one or more of the electronic cards 2 hosted in the housing 1, a device 19 for pressing a sink 16 onto a component 24 (of processor type) of an electronic card 2 hosted in the housing 1.

This pressing device 19 (two of which can be seen in FIG. 4) in effect makes a spring that bears:

firstly on the lower surface of the cover 4, in this implementation example, by a rectangular perimeter strip 22, secondly, on the electronic card 2, here by inclined tabs 20 placed opposite each bearing point 10 of the body 5 and fastened at their upper part to the rectangular perimeter strip, lastly on the upper part of the base of a sink 16, here by two very inclined strips 21, going from the longitudinal edges of the rectangular perimeter strip 22 and two sets of inclined tabs 23, going from the lateral edges of the rectangular perimeter strip 22.

Of course, the pressing device 19 is described here in the case of sinks 16 of the type with a flat base and a matrix of elongated vertical rectangular outgrowths.

The pressing device 19 is also realized in a material with very good thermal conductivity.

Implementation of the housing according to the invention is very quick and easy: after installing an electronic card 2 (comprising a processor in its central area) on the bearing points 10 of a housing 9 of the body 5, a sink 16 is placed on the processor 24, then the pressing device 19 is placed on the sink 16, lastly, the cover 4 is arranged above the pressing device 19, letting the upper part of the sink 16 pass through the recesses 15, provided for this purpose.

It is understood that the only mechanical function of the cover 4 is to ensure proper pressing of the sink 16 and of the electronic card 2 in its housing within the body 5.

The complete housing 1 is then inserted by sliding the lateral guides 3a, 3b in the slides of a compatible electronics bay until the connectors 12 come in contact with a corresponding connector ensuring electrical and data continuity (FIGS. 7 and 8). A set of similar electronics housings (eight housings 1 in the example shown in FIG. 6, where the cooling fans 16 are clearly visible) is thus incorporated in an electronics bay arranged on an airplane's equipment rack.

In operation, a set of fans supplies cooling of the housings by continuous renewal of air. In this case, more than 80% of the electronic cards' cooling is provided by convection.

On the other hand, however, if there is a breakdown of these fans, which is a design-critical issue from the in-flight safety angle, 80% of the cooling must be provided by conduction.

In this device, the sink 16 pressed onto the processor 24 forms thermal continuity with the pressing device 19, the cover 4 and the electronics bay; in this way and in conjunction with the cover 4, an excellent thermal conductor, it provides proper cooling of the electronic card 2.

Compared with prior devices, the thermal conduction between the two dissipating components and the electronics bay is here provided by the pressing spring and the housing cover, thus giving a large thermal conduction area, significantly greater than with existing housings.

This device also has the advantage of not requiring any screws to fix the electronic cards 2, sinks 16 or cover 4 of the housing 1, which simplifies maintenance and, for example, replacing an electronic card.

The scope of this invention is not limited to the details of the forms of realization considered above as an example, but on the contrary extends to modifications in the reach of the expert.

In the description above, the heat sink passes through the cover. It is clear that, depending on the type of heat sink used, it is not necessary to provide for this passage through the cover.

More generally, the housing as described is modular and it is easy to modify the type of cover used for a housing, or even to use pressing devices designed for various positions of the dissipating components on the electronic card.

In a realization variant, the material with high thermal conductivity is a composite with a metal matrix (nanotubes of carbon+aluminum).

The description of the invention presents the case of electronic cards whose active components are arranged on a single surface. In the case of cards with two dissipating surfaces, the principle of this device, designed to have firstly a mechanical means of supporting the card and secondly a means of thermal conduction, remains applicable.

In this case, the mechanical means of holding the card is a frame fastened to the electronic card by its edges and the housing comprises two dissipating covers, placed on either side of the electronic card, while resting on the central body.

The invention claimed is:

1. A housing for at least one electronic card comprising heat dissipating components on an upper surface, the housing comprising:
   at least one heat sink; and
   two half-shells that respectively define a cover and a body pressed together at lateral guides,
   the body comprising at least one bearing area forming a housing area for the at least one electronic card, and a pressing means that presses the at least one heat sink against an upper surface of the at least one electronic card, wherein,
   the pressing means further presses the at least one electronic card in the housing as the pressing means bears i) firstly, on a lower surface of the cover, ii) secondly, on the at least one electronic card, and thirdly, on an upper part of a base of the heat sink,
   the pressing means is made of a first material with a thermal conductivity equivalent or better than a thermal conductivity of copper, and
   the cover comprises a blank made of a second material having a thermal conductivity equivalent or better than the thermal conductivity of copper.

2. The housing according to claim 1, wherein the lateral guides are each formed of an upper half-guide which is part of the cover and of a lower half-guide which is part of the body.

3. The housing according claim 1, wherein the pressing means is a spring which bears firstly on an internal surface of the cover, secondly on the at least one electronic card, and thirdly, on the heat sink so as to press the heat sink on the heat dissipating component of the at least one electronic card.

4. The housing according to claim 3, wherein the pressing spring consists of a rectangular perimeter strip designed to be placed under the inner surface of the cover, of inclined tabs placed opposite each bearing area of the body and fastened at their upper part to the rectangular perimeter strip, of a set of inclined tabs, fastened at their upper part to the rectangular perimeter strip and designed to transmit a bearing force to the upper surface of the heat sink.

5. The housing according to claim 1, wherein the body is made of high temperature thermoplastic material.

6. The housing according to claim 5, wherein the high temperature thermoplastic material is (poly-ether-ether-ketone) loaded with short fibers.

7. The housing according to claim 5, wherein the body's surface is metalized.

8. The housing according to claim 1, wherein the cover further comprises lateral edges and two metal inserts on the lateral edges, each metal insert forming an upper half-guide which ensures thermal and electrical conduction between the cover and an electronics bay that receives the housing.

9. The housing according to claim 8, wherein the cover comprises a means of electromagnetic protection.

10. The housing according to claim 9, wherein the means of electromagnetic protection is a metalized strip linked to the metallic material that forms the metal inserts.

11. The housing according to claim 10, wherein the cover is made by a process that comprises a phase of laying up the fiber layers and the metalized strip on a preform, assembly with the metal inserts, then curing by heated means.

12. The housing according to claim 1, wherein the cover comprises on an upper surface at least one rectangular recess designed to let at least one heat sink pass.

13. The housing according to claim 1, wherein the thicknesses of the body and the cover are different: an available space ("b") in the housing under the electronic card being less than an available space ("a") above the electronic card.

14. The housing according to claim 1, wherein the first material of the pressing means is a metal matrix composite with nanotubes of carbon and aluminum.

15. The housing according to claim 1, wherein the second material of the cover is a laminate that includes a graphitized carbon fiber with a thermal conductivity higher than the thermal conductivity of copper.

16. The housing according to claim 1 in combination with the at least one electronic card housed within the housing,
wherein the pressing means presses the at least one heat sink against the upper surface of the at least one electronic card, and the pressing means bears i) firstly, on the lower surface of the cover, ii) secondly, on the at least one electronic card, and thirdly, on the upper part of the base of the heat sink.

17. A housing, comprising:
two electronic cards comprising heat dissipating components on an upper surface of each electronic card;
two half-shells respectively providing a cover and a body, the cover providing electromagnetic shielding of the electronic cards, the cover comprising a blank made of a material with a thermal conductivity equivalent to or greater than a thermal conductivity of copper; and
lateral guides fitted on opposite lateral surfaces of the body and the cover, the lateral guides pressing the cover and body together with the cover resting on the body, the lateral guides configured to slide the housing, in a closed condition, into an electronic bay, wherein,
the body comprises two hollow housings that are open facing the cover, and a central wall that separates the hollow housings from each other, the central wall having an upper edge facing the cover, each of the electronic cards resting over one of the hollow housings with a lower edge of each electronic card resting on a respective part of the upper edge of the central wall,
each hollow housing comprises bearing points on which a corresponding one of the electronic cards rest;
two heat sinks, each heat sink associated with a respective one of the electronic cards; and
a pressing device pressing each heat sink against an upper surface of the heat dissipating components of the respective one of the electronic cards, the pressing device being located between a lower surface of the cover and an upper surface of each electronic card and providing a spring that bears firstly on the lower surface of the cover, secondly on the upper surface of the respective one of the electronic cards, and thirdly against an upper part of a base of the heat sink,
wherein the pressing device is made of a material with a thermal conductivity equivalent or better than a thermal conductivity of copper, and
wherein the cover comprises a blank made of a material with a thermal conductivity equivalent or better than a thermal conductivity of copper.

18. The housing of claim 17, wherein,
the central wall further has a central stop (13) extending above the upper edge, each of the electronic cards resting over one of the hollow housings with the lower edge of each electronic card resting on the respective part of the upper edge of the central wall and with the central stop limiting residual lateral play of each electronic card, and
the pressing spring comprises i) a rectangular perimeter strip placed under the lower surface of the cover, ii) inclined tabs placed opposite each bearing area of the body and fastened, an upper part of the tabs fastened to the rectangular perimeter strip, iii) a set of inclined tabs with upper parts fastened to the rectangular perimeter strip and transmitting a bearing force to the upper surface of the heat sink.

19. The housing according to claim 18, wherein the cover further comprises on an upper surface a rectangular recess for each heat sink through which each heat sink passes.

* * * * *